US006330137B1

(12) United States Patent
Knapp et al.

(10) Patent No.: US 6,330,137 B1
(45) Date of Patent: Dec. 11, 2001

(54) MAGNETORESISTIVE READ SENSOR INCLUDING A CARBON BARRIER LAYER AND METHOD FOR MAKING SAME

(75) Inventors: Kenneth E. Knapp, Livermore; Robert E. Rottmayer, Fremont; Francis Ryan, Martinez, all of CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/330,461

(22) Filed: Jun. 11, 1999

(51) Int. Cl.$^7$ ...................................................... G11B 5/39
(52) U.S. Cl. ............................................... 360/324.2
(58) Field of Search ........................... 360/324.2, 324.1, 360/324.11, 324.12; 338/32 R; 324/207.21, 252

(56) References Cited

U.S. PATENT DOCUMENTS

| 5,862,022 | * | 1/1999 | Noguchi et al. ................... 360/324.2 |
| 5,898,547 | * | 4/1999 | Fontana, Jr. et al. ............. 360/324.2 |
| 6,103,305 | * | 8/2000 | Friedmann et al. ............... 427/249.7 |
| 6,201,673 | * | 3/2001 | Rottmayer et al. ............. 360/324.12 |

* cited by examiner

Primary Examiner—David L. Ometz
(74) Attorney, Agent, or Firm—Carr & Ferrell LLP; Robert D. Hayden; John S. Ferrell

(57) ABSTRACT

A magnetoresistive device includes an insulating barrier formed of carbon. In particular, the carbon can be diamond-like carbon, and more particularly, the carbon can be tetrahedral amorphous carbon (t-aC). The insulating barrier can be disposed between the free layer and pinned layer of a spin valve read sensor or otherwise incorporated with other various read sensor configurations. The insulating barrier is configured to increase a resistance of the read sensor with which it is incorporated, and thereby to increase the read signal. Such a barrier can be formed by cathodic arc deposition techniques, with substantially defect-free thicknesses from about 5 Å and above, and band gap values in the range of about 1 eV to about 5.4 eV.

14 Claims, 6 Drawing Sheets

MAGNETORESISTIVE READ SENSOR INCLUDING A CARBON BARRIER LAYER AND METHOD FOR MAKING SAME

BACKGROUND OF THE INVENTION

This invention relates generally to magnetic data storage systems, more particularly to magnetoresistive read heads, and most particularly to structures incorporating an insulating barrier, as well as methods for making the same.

Magnetic disk drives are used to store and retrieve data for digital electronic apparatuses such as computers. In FIGS. 1A and 1B, a magnetic disk data storage system 10 of the prior art includes a sealed enclosure 12, a disk drive motor 14, and a magnetic disk, or media, 16 supported for rotation by a drive spindle S1 of motor 14. Also included are an actuator 18 and an arm 20 attached to an actuator spindle S2 of actuator 18. A suspension 22 is coupled at one end to the arm 20, and at its other end to a read/write head or transducer 24. The transducer 24 typically includes an inductive write element with a sensor read element (which will be described in greater detail with reference to FIG. 2). As the motor 14 rotates the magnetic disk 16, as indicated by the arrow R, an air bearing is formed under the transducer 24 causing it to lift slightly off of the surface of the magnetic disk 16, or, as it is termed in the art, to "fly" above the magnetic disk 16. Alternatively, some transducers, known as "contact heads," ride on the disk surface. Data bits can be read along a magnetic "track" as the magnetic disk 16 rotates. Also, information from various tracks can be read from the magnetic disk 16 as the actuator 18 causes the transducer 24 to pivot in an arc as indicated by the arrows P. The design and manufacture of magnetic disk data storage systems is well known to those skilled in the art.

FIG. 2A depicts a magnetic read/write head 24 including a write element 28 and a read element 26. The edges of the write element 28 and read element 26 also define an air bearing surface ABS, in a plane 29, which can face the surface of the magnetic disk 16 of FIGS. 1A and 1B.

The write element 28 is typically an inductive write element. A write gap 30 is formed between an intermediate layer 31, which functions as a first pole, and a second pole 32. Also included in write element 28, is a conductive coil 33 that is positioned within a dielectric medium 34. As is well known to those skilled in the art, these elements operate to magnetically write data on a magnetic medium such as a magnetic disk 16.

The read element 26 includes a first shield 36, the intermediate layer 31, which functions as a second shield, and a read sensor 40 that is located between the first shield 36 and the second shield 31. A common type of read sensor 40 used in the read/write head 24 is a magnetoresistive (MR) sensor. A MR sensor (e.g., AMR or GMR) is used to detect magnetic field signals by means of a changing resistance in the read sensor. When there is relative motion between the MR sensor and a magnetic medium (such as a disk surface), a magnetic field from the medium can cause a change in the direction of magnetization in the read sensor, thereby causing a corresponding change in resistance of the read element. The change in resistance can then be detected to recover the recorded data on the magnetic medium.

While some read sensors operate in current-in-plane (CIP) mode, others operate in current-perpendicular-to-plane (CPP) mode. FIG. 2B is a perspective view of a read sensor 40 that operates in CPP mode. A bottom lead 42 is in electrical contact with a bottom layer 44 of the read sensor 40, while a top lead 48 is in electrical contact with a top layer 46 of the read sensor 40. While the top and bottom leads 48, 42 are shown electrically insulated from the second and first shields 31, 36, respectively, they can alternatively be coincident, with the shields operating as leads.

A sensing current I is passed between the top and bottom leads 48, 42, and therefore passes substantially perpendicular through the read sensor layers 50, including the top and bottom layers 46, 44. As with other MR read sensors, this sensing current is used in conjunction with changing resistance of the read sensor to detect data from nearby magnetic media. Various read sensors can be used in the CPP mode, with various layers and their combinations. For example, a spin valve read sensor can be used, various configurations and formations of which are known to those skilled in the art.

Increasing read performance is a function of increase of the signal $\Delta V$ that can be detected across the read sensor 40. In turn, the signal $\Delta V$ detected from operation of the read sensor is a function of the sensing current I that is passed through the read sensor, and the sensor resistance change $\Delta Rs$ during operation. More particularly, as is well know in the art, the signal $\Delta V$ is essentially equal to the product of the sensing current I and the sensor resistance change $\Delta Rs$.

Spin valve sensors rely on the magneto tunneling effect, which is believed to be a result of the asymmetry in the density of states of the majority and minority energy bands in a ferromagnetic material. Thus, the sensor resistance, which is inversely proportional to the spin-polarized tunneling probability, depends on the relative magnetization orientations of the two electrodes on either side of an insulating barrier layer. In the parallel orientation there is a maximum match between the number of occupied states in one electrode and available states in the other. In the antiparallel configuration the tunneling is between the majority states in one electrode and minority states in the other. W. J. Gallagher, S. S. Parkin et al., J Appl. Phys. 81 (8) April 1997, p.3741–6.

To maximize the effectiveness of such an insulating barrier layer it is desirable to minimize any defects that could create shorting through the layer, which would render it substantially ineffective. The thickness T of the insulating barrier, measured along the current path, is also desired to be minimized while maintaining a barrier. It is also desirable to maintain a band gap on the order of about 1 eV to about 10 eV, where the band gap is a measure of the separation between the energy of the lowest conduction band and the highest valence band. Further, it is desirable to maximize the smoothness of the surface of the insulating barrier on which a succeeding layer is to be formed.

In the past, read sensor designs have included insulating barriers formed of alumina. Alumina insulating barriers can be formed by known methods, including deposition of aluminum metal by physical vapor deposition, evaporation, or ion beam deposition, for example. After such deposition, the aluminum can then be oxidized in $O_2$ plasma. Such processes can result in an alumina layer having a thickness T in the range of about 10 Å to about 50 Å, and a band gap in the range of about 1 eV to about 5 eV. While such thicknesses and band gap values may be adequate, unfortunately these processes and materials result in significant defects, and therefore significant probability of shorting.

Alumina and other materials formed by reactive sputtering can alternatively be used to form an insulating barrier. For example, hafnium oxide ($HfO_2$), zirconium oxide ($ZrO_2$), or tantalum oxide ($Ta_2O_5$) can be formed by reactively sputtering from a metallic target using an RF or DC magnetron. However, while these oxides may be able to exhibit satisfactory band gap values and thicknesses, they still may be likely to include defects that may result in shorting. Further, each of these materials can be adversely affected by techniques that may be used in later processing operations of the read element, read/write head, or slider. For example, these materials may be soluble in one or more of the developers or strippers used in conjunction with photoresistive materials used during fabrication. Agents such as fluorine or chlorine would need to be used in the RIE processing, however these may cause undesirable corrosion of other device elements. Of course, physical sputtering with ion beam etching could be used instead of RIE, however this might not lend the same degree of selectivity, as is known by those of ordinary skill in the art.

In a particular read sensor design it also may be desired to maintain a particular maximum limit of a shield-to-shield spacing STS1 between the first and second shields 36 and 31. In particular, this is desired to reduce the pulse width for facilitating higher data density reading. Thus, minimizing the thickness T of the insulation barrier can facilitate maintaining the shield-to-shield spacing STS1, and may add flexibility to thicknesses of other layers.

Thus, what is desired is a read sensor that includes an insulation barrier that is more defect free than the insulation barriers of the prior art, while maintaining at least comparable band gap values and thicknesses. Further it is desired that such an insulation barrier be more robust with respect to typical fabrication processes, without involving substantially greater cost or complexity.

SUMMARY OF THE INVENTION

The present invention provides a magnetoresistive device and method for making the same that provides high performance. Specifically, a high resistance read sensor that is robust with respect to a wide range of fabrication techniques is provided.

In an embodiment of the present invention, a magnetoresistive device includes a first lead, a second lead, and a multilayer read sensor disposed between the first lead and the second lead. The multilayer read sensor also includes a first surface and a second surface, wherein the first surface is in electrical contact with one of the first lead and the second lead, and the second surface is in electrical contact with another of the first lead and the second lead. Further, the multilayer read sensor includes an insulating barrier layer including carbon. The carbon can be diamond-like carbon, and can be tetrahedral amorphous carbon. In certain embodiments, the multilayer read sensor includes a pinned layer formed of ferromagnetic material, and a free layer formed of ferromagnetic material, wherein the insulating barrier is disposed between the pinned layer and the free layer.

In another embodiment of the present invention, a system for reading and writing data on a magnetic storage medium, includes a read element. The read element includes a read sensor having an insulating barrier layer that includes carbon. The system also includes a write element configured to magnetically record data on the medium. In certain embodiments, the insulating barrier consists essentially of tetrahedral amorphous carbon and has a thickness that is greater than or equal to about 5 Å. Also, in certain embodiments, the read element further includes a first lead in contact with a first surface of the read sensor, and a second lead in contact with a second surface of the read sensor. In such embodiments, the first lead and second lead are configured to pass a current therebetween and through the read sensor.

In still other alternatives, the system can further include a medium support that is capable of supporting the medium and moving the medium in relation to a read/write head that includes the write element and the read element. Such embodiments can also include a read/write head support system for suspending said read/write head above said medium.

In yet another embodiment, a method of forming a magnetoresistive device includes providing a first lead and forming a read sensor having a first surface and a second surface above the first lead. This includes forming an insulating barrier of carbon, and electrically connecting the first surface of the read sensor to the first lead. The method also includes forming a second lead above the read sensor, including electrically connecting the second lead to the second surface of the read sensor. In some embodiments, the insulating barrier of carbon can be formed using cathodic arc deposition techniques.

Because the insulating barrier is formed of carbon, it is more robust with respect to various typical fabrication techniques. For example, the carbon is substantially impervious to various agents utilized in photoresistive processing, such as developers and strippers. Further, reactive ion etching (RIE) can be performed with oxygen plasma, thereby maintaining etching selectivity without incurring corrosion problems that may be concomitant with the use of fluorine and chlorine in RIE processes. Further, in the present invention, the carbon insulation barrier can be formed substantially defect free, very thinly, with a good band gap value, and with a smooth surface.

These and other advantages of the present invention will become apparent to those skilled in the art upon a reading of the following descriptions of the invention and a study of the several figures of the drawing.

BRIEF DESCRIPTION OF THE DRAWINGS

The present invention will be readily understood by the following detailed description in conjunction with the accompanying drawings, and like reference numerals designate like elements.

DETAILED DESCRIPTION OF THE PREFERRED EMBODIMENTS

FIGS. 1A, 1B, 2A, and 2B were discussed with reference to the prior art.

Figure 1A:
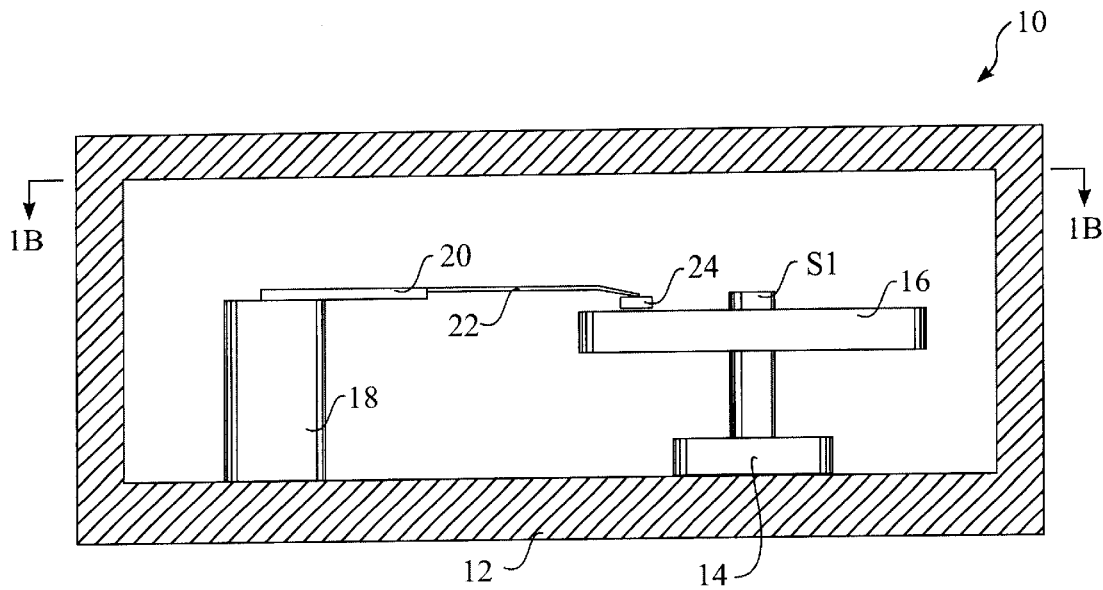
FIG. 1A is a partial cross-sectional elevation view of a magnetic data storage system.
Figure 1B:
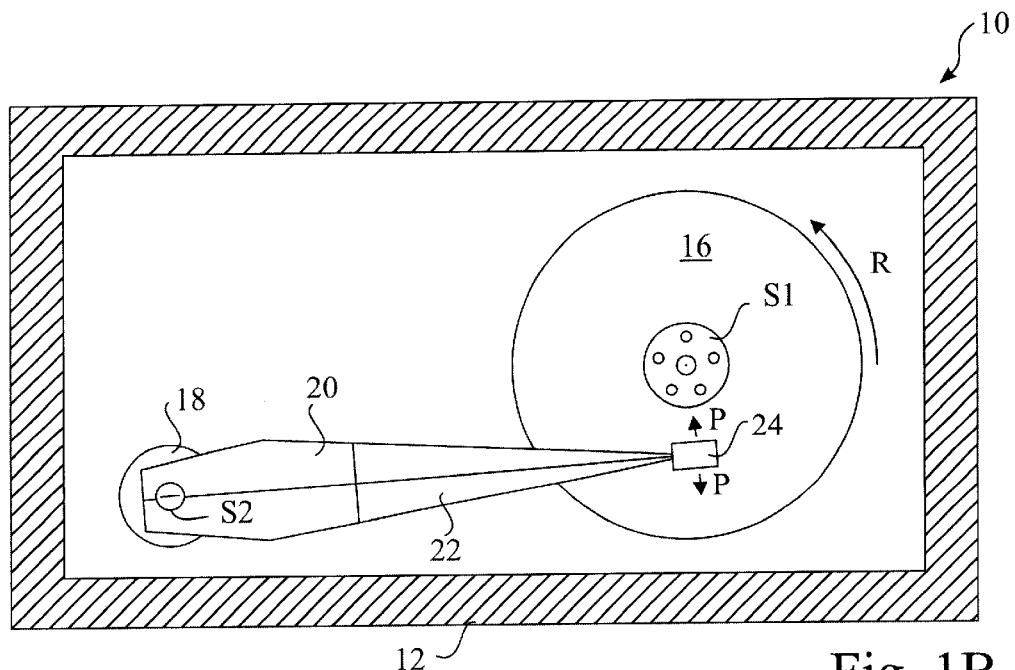
FIG. 1B is a top plan view along line 1B—1B of FIG. 1A.
Figure 2A:
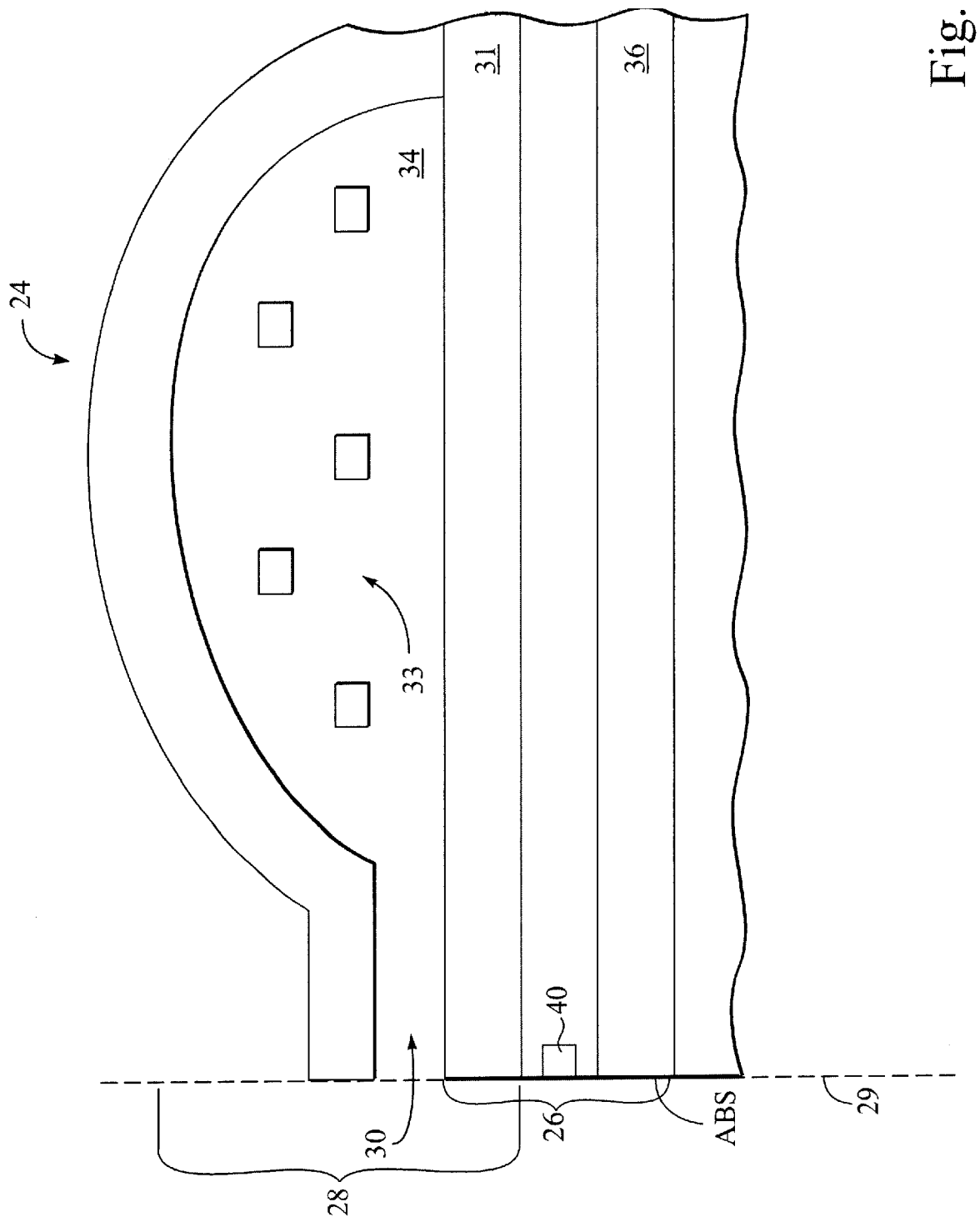
FIG. 2A is a cross-sectional view of a read/write head of the magnetic disk drive assembly of FIGS. 1A and 1B.
Figure 2B:
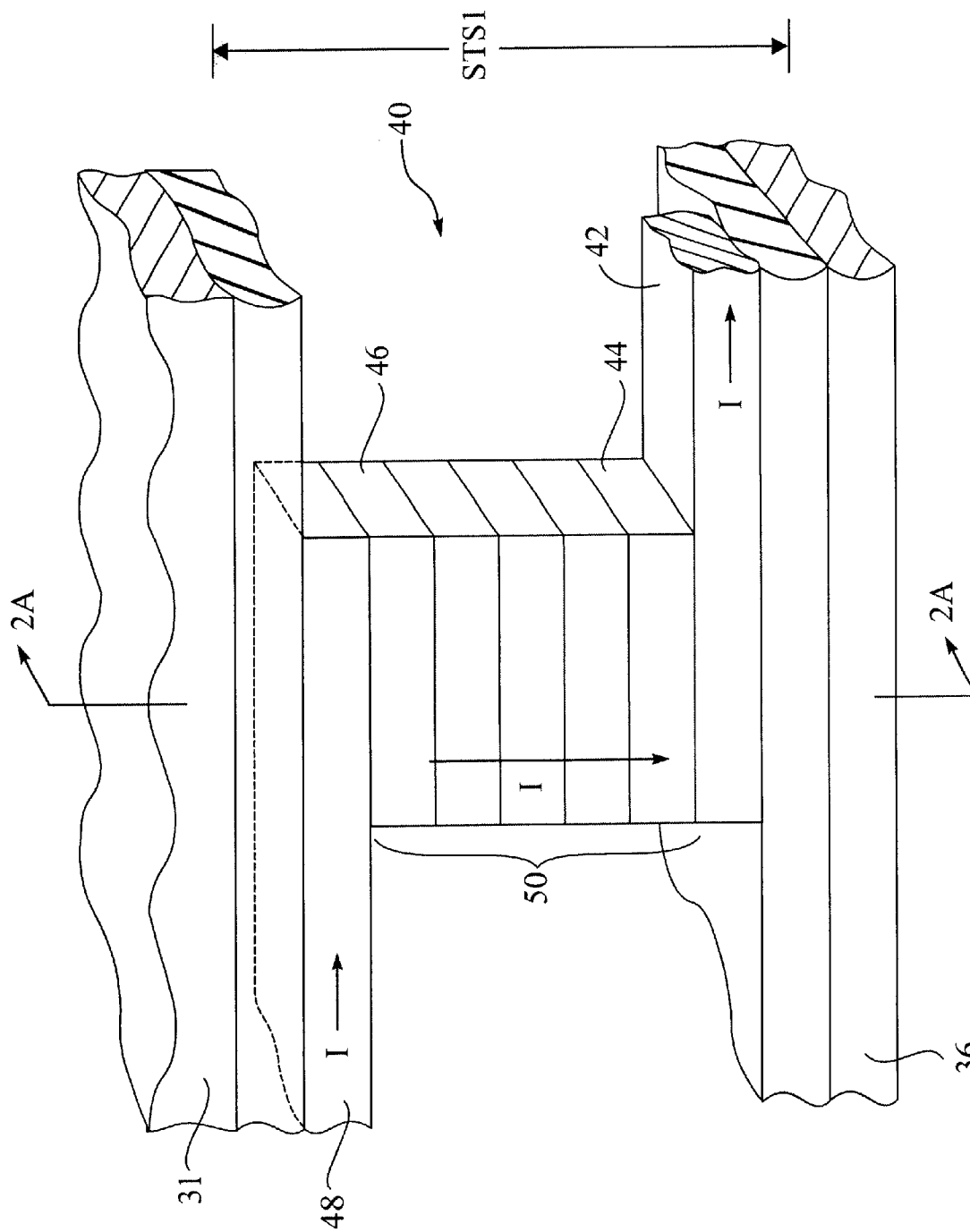
FIG. 2B is a partial perspective view of a read element of the read/write head of FIG. 2.
Figure 3:
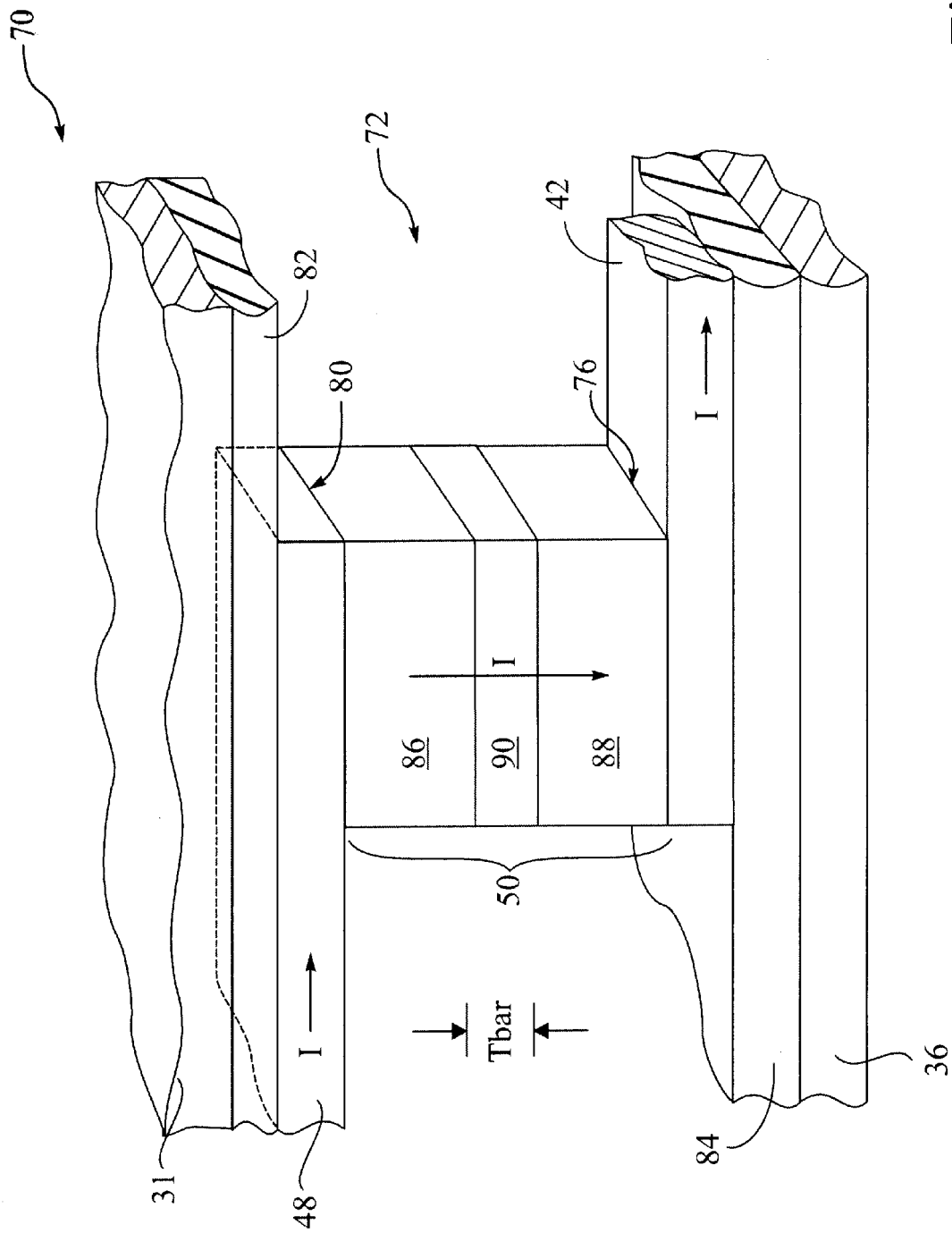
FIG. 3 is a partial perspective view of a read element, according to an embodiment of the present invention.

FIG. 3 is a partial perspective view of a read element 70, according to an embodiment of the present invention. The read element 70 includes a first shield 36 and a second shield 31, and a read sensor 72 disposed between the first and second shields. A bottom lead 42 is electrically connected to a bottom surface 76 of the read sensor 72. In addition, a top lead 48 is electrically connected to a top surface 80 of the read sensor 72. The top and bottom leads 48, 42 are electrically insulated from the second and first shields 31, 36, respectively, by intervening first and second dielectric layers 82, 84 respectively. Of course, in alternative embodiments, the first and second shields 36, 31 can also operate in the place of the first and second leads. In such a case, the first and second dielectric layers 82, 84 also need not be included.

The first and second shield 36, 31 provide magnetic shielding for the read sensor 72, and are accordingly formed of suitable magnetic materials, preferably with high permeability. In addition, the top and bottom leads 48, 42 are formed of highly conductive material, such as copper, gold, tantalum, tungsten, or molybdenum, and are configured to pass a sensing current I between them and through the read sensor 72. To prevent electrical shunting between the leads and the shields, the first and second dielectric layers 82, 84 are formed of suitable electrically insulating materials and are disposed therebetween.

The read sensor 72 includes a free layer 86, a pinned layer 88, and an insulating barrier 90 disposed between the free and pinned layers 86, 88. The free layer 86 can operate as a sensing layer, and therefore has a magnetization that is substantially free to move in response to external magnetic fields, such as from a nearby magnetic medium. Accordingly, the free layer 86 can be formed of a soft ferromagnetic material such as permalloy (NiFe), cobalt, CoFe, or CoFeNi.

To operate properly, the pinned layer 88 has a magnetization that is pinned to an alignment that is appropriate relative to the magnetization of the free layer 86. The pinned layer 88 can have one of various suitable configurations known to those with skill in the art, including a configuration that is sometimes referred to as a laminated antiparallel pinned layer or a synthetic antiferromagnet. While the free and pinned layers 86, 88 are shown electrically connected to the top and bottom leads 48, 42, respectively, the reverse connections can alternatively be made.

The insulating barrier 90 having a thickness $T_{bar}$, can increase the resistance Rs of the read sensor 72. More specifically, the resistance to the sensing current I is increased because electron transport across the insulating barrier 90 takes the form of electrons tunneling through the barrier in response to a voltage potential across the barrier. The insulating barrier 90 of the present invention is formed of carbon. Because it is formed of carbon, the insulating barrier 90 is substantially non-susceptible to various photoresistive agents and processes.

In certain embodiments of the present invention, the insulating barrier 90 is formed more specifically of diamond-like carbon (DLC), which can be substantially defect free, smooth, and exhibiting a band gap that is comparable to that exhibited by alumina and other oxides, such as $HfO_2$, $ZrO_2$, and $Ta_2O_5$. These characteristics support a strong resistance Rs of the read sensor 72. In particular embodiments of the present invention where the diamond-like carbon is tetrahedral amorphous carbon (t-aC), the resistance Rs, and therefore sensing signal $\Delta V$ of the read sensor 72 can be particularly strong. For example, the band gap of the t-aC can be in the range of about 2 eV to about 5.4 eV. Also, because of the smoothness of the insulating barrier 90, the necessary degree of atomic bonding between the free layer 86 and the insulating barrier 90 can be achieved. Of course, if the pinned layer is alternatively formed above the insulating barrier 90, the smoothness of the insulating barrier 90 will facilitate the necessary atomic bonding between the insulating barrier 90 and the pinned layer 88.

Figure 4:
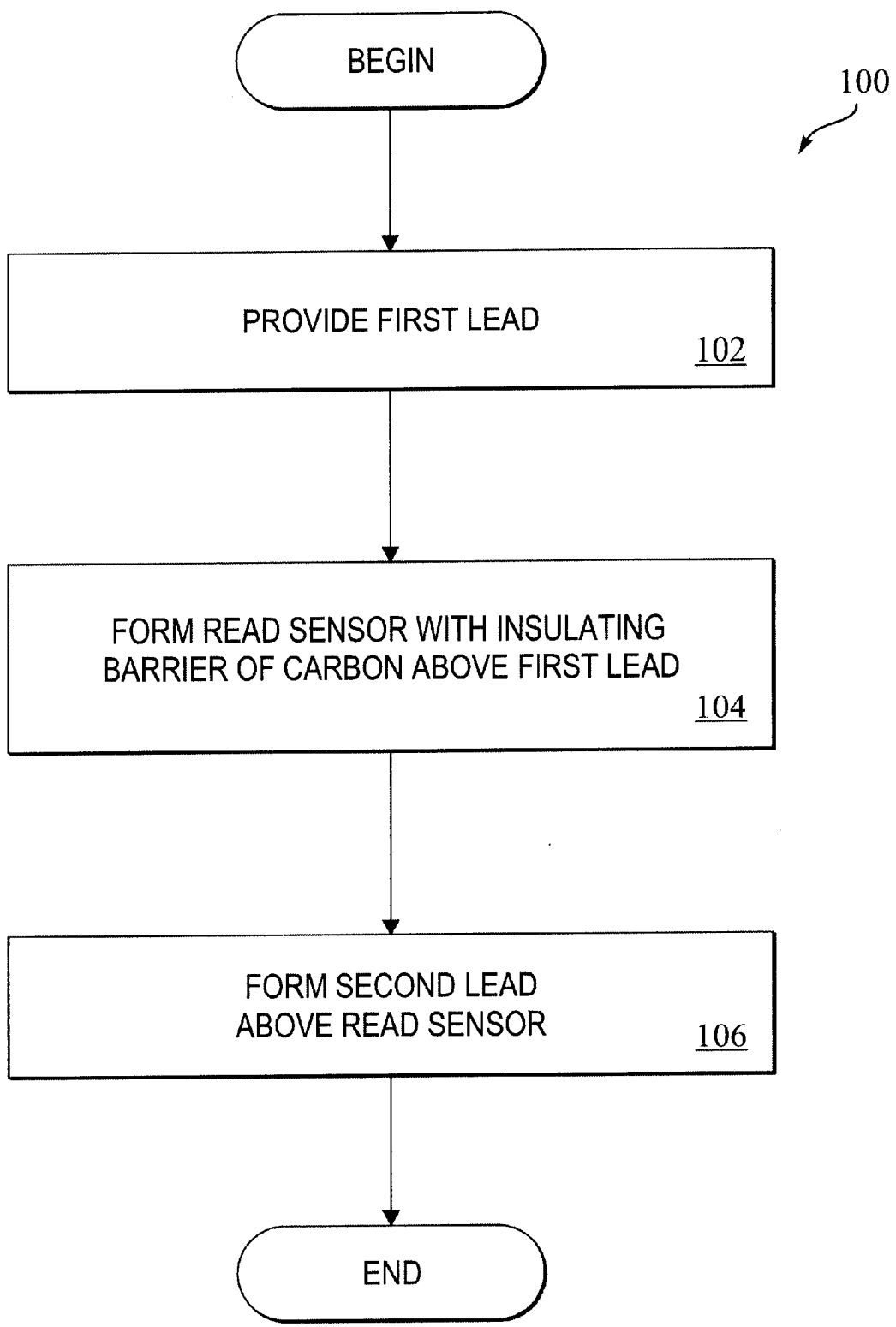
FIG. 4 is a process diagram of a method for fabricating a read sensor, according to an embodiment of the present invention.

FIG. 4 depicts a process diagram of a method 100 for forming a magnetoresistive device, according to an embodiment of the present invention. A first lead is provided in operation 102. The first lead can be provided, for example above a first shield, from which it is separated by a first dielectric layer. Further, the first lead can be formed of any suitable conductive material, such as copper, gold, tantalum, tungsten, or molybdenum. The first lead can be formed with known processes in the art, such as masking and plating.

In operation 104, a read sensor is formed above the first lead with an insulating barrier of carbon. The formation of the insulating barrier can increase the resistance of the sensor. Operation 104 is described in further detail below with reference to FIG. 5.

A second lead is formed above the read sensor in operation 106. The second lead can be formed of any suitable highly conductive material, such as copper or gold, and with any suitable processes known in the art, such as masking and plating. Additional operations can also be included in method 100 to further incorporate the read sensor and leads into a read element, read/write head, read/write head gimbal assembly, or disk drive system, for example.

Figure 5:
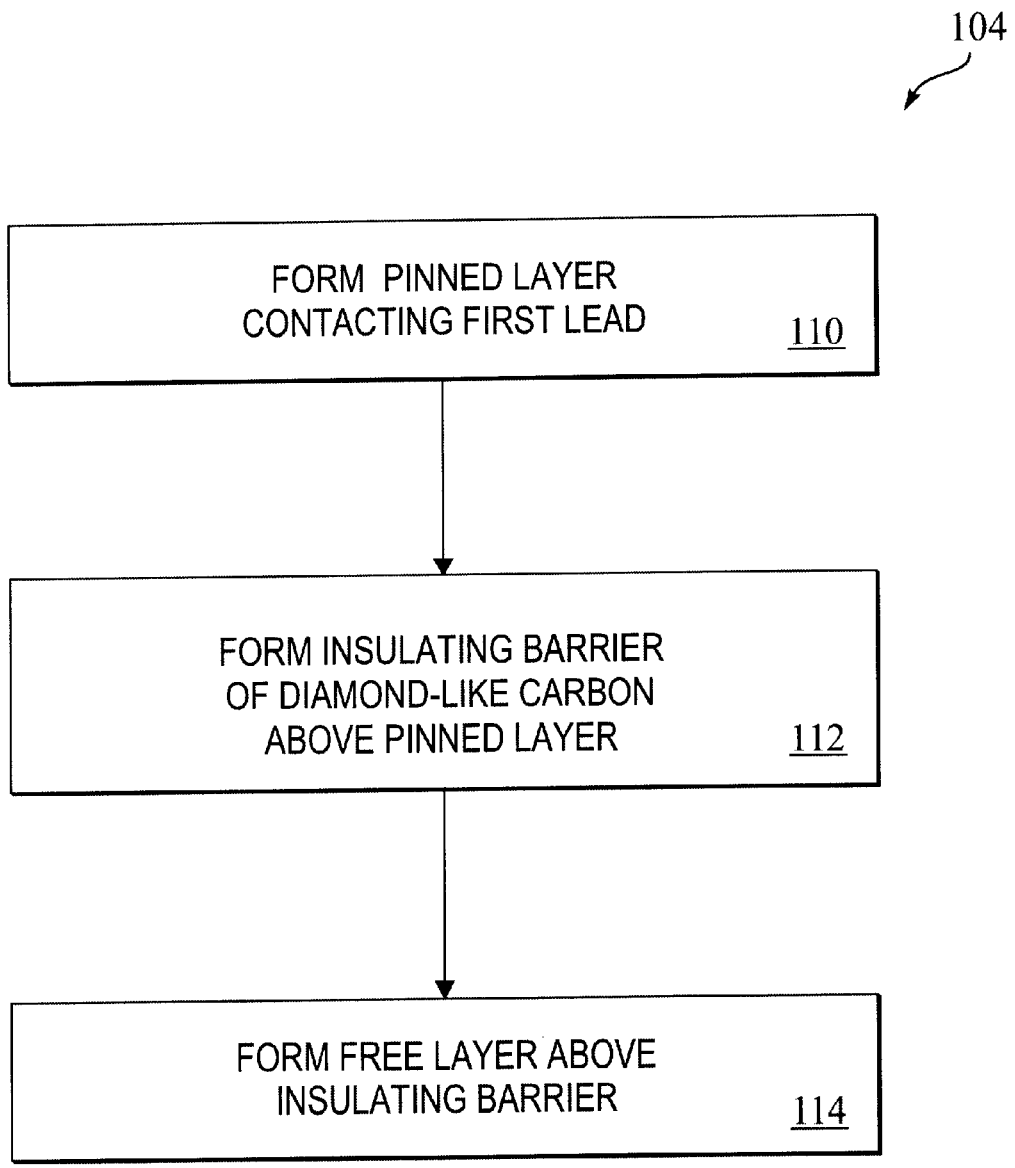
FIG. 5 is a process diagram of an operation of the method of FIG. 4.

FIG. 5 is a process diagram further detailing operation 104 of method 100 in FIG. 4. A pinned layer is formed in operation 110 and is electrically contacted with the first lead. The pinned layer is formed of one or more ferromagnetic materials, and has a substantially fixed magnetization in a particular desired direction, as is well known to those with skill in the art. Forming the pinned layer can include forming one or more layers, and may further include known processes for setting the particular magnetization direction.

In operation 112, an insulating barrier is formed of diamond-like carbon (DLC) above the pinned layer. This formation can be performed using cathodic arc deposition techniques that are known to those with skill in the art. In particular, for filtered cathodic arc depositions, a substrate bias of between about 0V and about 1000V works well. With such techniques, the DLC can be formed substantially hydrogen free and without an adhesion layer, unlike with some other DLC formation techniques, such as ion beam deposition. Further, with the cathodic arc deposition techniques, the DLC can be formed with a tetrahedral amorphous structure to form tetrahedral amorphous carbon.

The tetrahedral amorphous ordering of the carbon can be substantially defect free and very smooth, thereby promoting both effective sensor resistance and effective atomic coupling with the free layer of operation 114 (discussed below). Additionally, because such ordering is substantially similar to the ordering of diamonds, they may exhibit a band gap similar to that of diamonds, which is in the range of about 2 eV to about 5.4 eV. As an additional advantage, with the cathodic arc deposition techniques, the insulating barrier can be formed with a very thin thickness. More specifically, the insulating barrier can be formed in operation 112 with a thickness of greater than or equal to about 5 Å, with a thickness in the range of about 5 Å to about 100 Å working well. With such a thin insulating barrier, there is increased homogeneity, which improves the resistive performance of the barrier; and conserves shield-to-shield spacing between the first and second shields, which can further improve the read performance.

A free layer is formed in operation 114, above the insulating barrier formed in operation 112. The free layer can be formed of any suitable ferromagnetic material, such as a high permeability material, for example permalloy. The free layer can be the sensing layer of the read sensor formed in operation 104, and therefore has a magnetization that is substantially free to rotate in reaction to an external magnetic field, for example from a magnetic medium.

In summary, the present invention provides structures and methods for providing a magnetoresistive device that has higher read signal, and therefore higher performance capabilities that can be used in high density applications. The invention has been described herein in terms of several preferred embodiments. Other embodiments of the invention, including alternatives, modifications, permutations and equivalents of the embodiments described herein, will be apparent to those skilled in the art from consideration of the specification, study of the drawings, and practice of the invention. For example, the insulating barrier of the present invention can be incorporated with a variety of read sensors having different layers and configuration than that described above. In addition, the above described read sensor can be incorporated with a write element to provide a read/write head, or further incorporated with other components to form a slider, a head gimbal assembly (HGA), or a disk drive system. The embodiments and preferred features described above should be considered exemplary, with the invention being defined by the appended claims, which therefore include all such alternatives, modifications, permutations and equivalents as fall within the true spirit and scope of the present invention.

What is claimed is:

1. A magnetoresistive device, comprising:
   a first lead;
   a second lead; and
   a multilayer read sensor disposed between said first lead and said second
   lead and including an insulating barrier layer including tetrahedral
   amorphous carbon disposed between a free layer and a pinned layer.

2. The magnetoresistive device as recited in claim 1, wherein said multilayer read sensor includes said pinned layer formed of ferromagnetic material, and said free layer formed of ferromagnetic material, wherein said insulating barrier is disposed between said pinned layer and said free layer.

3. The magnetoresistive device as recited in claim 1, wherein said insulating barrier layer exhibits a band gap in the range of about 1 eV to about 5.4 eV.

4. The magnetoresistive device as recited in claim 1, wherein said insulating barrier layer has a thickness that is greater than or equal to about 5 Å.

5. The magnetoresistive device as recited in claim 4, wherein said insulating barrier layer has a thickness that is in the range of about 5Å to about 100 Å.

6. A system for reading and writing data on a magnetic storage medium, comprising:
   a read element including a read sensor having an insulating barrier layer
   including tetrahedral amorphous carbon disposed between a free layer and
   a pinned layer; and
   a write element configured to magnetically record data on said medium.

7. The system as recited in claim 6, wherein said insulating barrier has a thickness that is greater than about 5 Å.

8. The system as recited in claim 6, wherein said read element further includes:
   a first lead in contact with a first surface of the read sensor; and
   a second lead in contact with a second surface of the read sensor, wherein said first and second leads are configured to pass a current therebetween and through said read sensor.

9. The system as recited in claim 8, further comprising:
   a medium support that is capable of supporting said medium and moving said medium in relation to a read/write head that includes said write element and said read element; and
   a read/write head support system for suspending said read/write head above said medium.

10. The system as recited in claim 9, wherein said read/write head support system includes means for moving said read/write head relative to said medium; and wherein said medium support includes a spindle on which said medium can be supported, said spindle having an axis about which said medium can rotate, and a medium motor connected to said spindle and capable of facilitating said moving of said medium relative to said read/write head.

11. A method of forming a magnetoresistive device, comprising:
    providing a first lead;
    forming a read sensor having a first surface and a second surface above said first lead, including forming an insulating barrier of tetrahedral amorphous carbon, and electrically connecting said first surface of said read sensor to said first lead;
    forming a second lead above said read sensor, including electrically connecting said second lead to said second surface of said read sensor.

12. The method as recited in claim 11, wherein forming said read sensor includes forming a pinned layer of ferromagnetic material.

13. The method as recited in claim 11, wherein forming said insulating barrier includes cathodic arc deposition of carbon.

14. The method as recited in claim 11, wherein forming said read sensor includes forming a pinned layer of ferromagnetic material and forming a free layer of ferromagnetic material, and wherein said insulation barrier is formed between said pinned layer and said free layer.

* * * * *